United States Patent
Zhou et al.

(10) Patent No.: US 7,473,501 B1
(45) Date of Patent: Jan. 6, 2009

(54) METHOD FOR REDUCING PHOTO-MASK DISTORTION

(75) Inventors: Nancy Chenxin Zhou, Essex Junction, VT (US); Kenneth C Racette, Fairfax, VT (US); Robert James Nolan, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/058,724

(22) Filed: Mar. 30, 2008

(51) Int. Cl.
*G03F 1/00* (2006.01)
*A47G 1/12* (2006.01)

(52) U.S. Cl. ............................................. 430/5; 428/14
(58) Field of Classification Search .................. 430/5; 428/14; 355/75
See application file for complete search history.

(56) References Cited

U.S. PATENT DOCUMENTS

| | | | |
|---|---|---|---|
| 4,804,600 A | 2/1989 | Kato et al. | |
| 6,692,878 B2 | 2/2004 | Tsai et al. | |
| 6,720,116 B1 | 4/2004 | Tzu et al. | |
| 7,205,074 B2 | 4/2007 | Boyd | |
| 2006/0281014 A1* | 12/2006 | Maria Loos et al. | 430/5 |

FOREIGN PATENT DOCUMENTS

| | | |
|---|---|---|
| JP | 02254448 | 10/1990 |
| JP | 06120124 | 4/1994 |

OTHER PUBLICATIONS

Carufe et al., "Photomask Pellicle Support Ring Design", TDB Jun. 1984 p. 769.

* cited by examiner

*Primary Examiner*—Stephen Rosasco
(74) *Attorney, Agent, or Firm*—PRTSI, Inc.; Martin D. Moynihan

(57) ABSTRACT

The present invention describes a structure and method for reducing or eliminating the flatness distortion effects of a photomask assembly which occurs when a pellicle is mounted to the photomask. The invention is to perform a partial disconnection of the mounting area of the pellicle frame from the print area of the mask. An exemplary embodiment of the present invention achieves the distortion reduction or elimination using a trench in the photomask as the partial disconnection.

1 Claim, 1 Drawing Sheet

METHOD FOR REDUCING PHOTO-MASK DISTORTION

FIELD OF THE INVENTION

The invention is in the field of photomask making and assembly.

BACKGROUND

Photomask flatness is an important concern in the fabrication and application of photomasks in lithography for semiconductor manufacturing. With the advancement of technology, feature sizes are decreasing, thus requiring a larger numerical aperture (NA) that results in smaller depth of focus. As a result, photomask flatness is no longer a negligible component because a slight curvature will not only reduce the depth of focus, but also create a lateral image shift.

Recently, studies have shown that photomask pellicles play an important role in impacting the final photomask flatness. These studies demonstrate that the attachment of a mask pellicle can distort the final mask due to the interaction between the mask shape and the pellicle frame shape. The attachment of the pellicle frame has been shown to cause an additional distortion averaging 300 nm total indicated readout (TIR) of point to point difference from the patterned mask. In addition, pellicle attachment often causes sharp, localized shape changes within the print area. The flatness deviation after pellicle attachment depends on the pellicle frame flatness and the shape matching to the photomask flatness. Therefore, reducing these pellicle effects can insure flatter, more uniform masks resulting in improvement in printed wafer quality.

SUMMARY

The present invention provides a method and apparatus for the reduction or elimination of flatness distortion of a photomask caused by an attachment of a pellicle frame, said photomask with attached pellicle frame comprising three concentric areas, including a first innermost print area, a second area surrounding said first innermost print area, and a third area surrounding and rigidly connected to said second area which is rigidly connected to said first innermost print area. An embodiment of the invention includes a partial disconnection of the third area from the first innermost print area to provide a more flexible connection between the two areas. The pellicle frame is attached to the photomask in the third area.

DETAILED DESCRIPTION OF INVENTION

The present invention provides a method and apparatus for the reduction of flatness distortion of a photomask substrate and the negative effects on the print area of the photomask that may occur due to the attachment of a pellicle to the substrate. The pellicle is comprised of a pellicle membrane attached to a pellicle frame. The pellicle frame is attached to the photomask substrate. The present invention includes the partial disconnection of an area between the print area of the photomask and the area of the attached pellicle frame to provide a more flexible connection between said print area and area of pellicle frame connection. In this way pressure of the frame in the area of its mounting won't translate into as much distortion in the print area. This partial disconnection to make the more flexible connection can be done in several ways. One example is creating a physical trench in the substrate or the mask and mounting the pellicle outside the trench. Another example is creating a smaller mask substrate and flexibly attaching it to a holder the size of the current mask and mounting the pellicle on the holder. A further example is creating a larger holder and flexibly attaching it around the current mask with the pellicle mounted on the holder.

Figure 1:
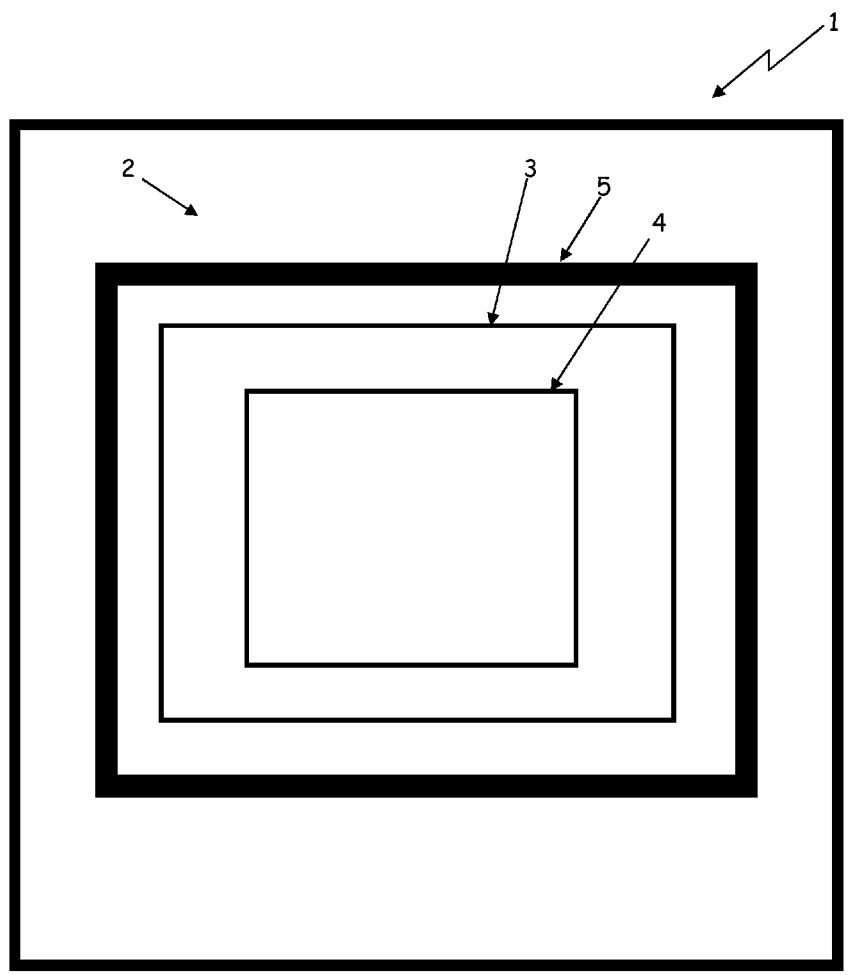
FIG. 1 shows a top view an exemplary embodiment of the invention in which a trench in the mask substrate separates the print area from the attached pellicle frame.

FIG. 1 shows an exemplary embodiment of the present invention in which a photomask 1 comprises a large patternable substrate 2. A trench 3 is then formed in the pattern-able substrate 2. The trench 3 may be formed by any of several methods. Such methods include using a diamond saw, chemical etching, laser ablation and ion milling. Studies have shown that a trench depth of between 1 to 5 mm produces good results. In addition the trench 3 may be formed either on the front (typically the chrome side) or the back (typically the quartz side) of the photomask 1. The trench 3 could be formed at any one of several points in the photomask production process. First, the trench 3 could be placed in the original quartz mask substrate, before or after polishing of the substrate. This first point is preferable in that the trench 3 could be created by the supplier so that polishing and annealing can be done to ensure overall flatness. Second, the trench 3 could be added to the photomask blank after metal film deposition, but before resist deposition. Lastly, it could be added to the photomask after photomask patterning, but before pellicle mounting. Thorough cleaning of the substrate, photomask blank, or photomask is next performed to remove any processing residues resulting from the trench 3 formation.

Next the mask is printed. FIG. 1 shows the resultant printed area 4. The printed area 4 is within an area formed by the surrounding trench 3. Then the pellicle frame 5 is mounted outside of the trench area.

Figure 2:
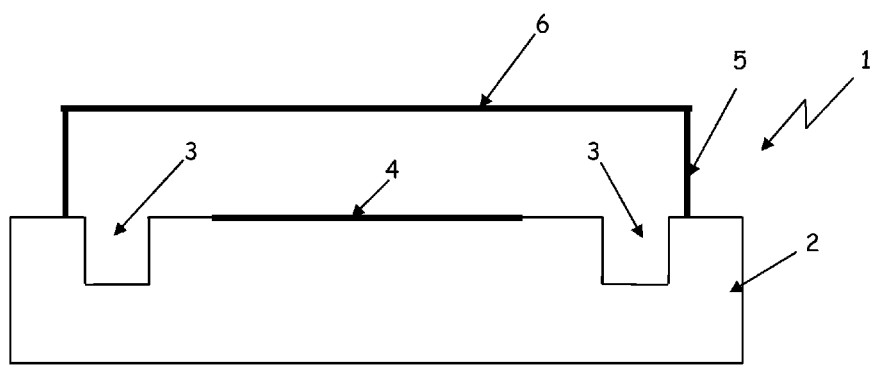
FIG. 2 shows a cross section view of the exemplary embodiment of the invention showing the trench in the mask substrate separating the print area from the attached pellicle frame.

FIG. 2 shows the same photomask 1 as described in FIG. 1 above, but in a cross-sectional view. One can see the trench 3 formed in the print-able substrate 2 and surrounding the printed area 4. Also shown is the pellicle frame 5 which is mounted outside the trench 3.

Additionally, the pellicle membrane 6 is shown extending between two sides of the pellicle frame 5.

While the exemplary embodiment of the partial disconnection to provide a more flexible connection between the print area and the mounting area of the pellicle frame was described as the trench, the two other methods and structures using flexibly joined holders could also be applied with similar results.

The invention claimed is:

1. A method for reducing flatness distortion of a photomask caused by an attachment of a pellicle frame, said photomask comprising a single, one piece, integral substrate having three concentric areas, including a first innermost print area, a second area surrounding said first innermost print area, and a third area surrounding and rigidly connected to said second area which is rigidly connected to said first innermost print area, said method comprising:

removing a portion of material from the second area, thereby partially disconnecting the third area from the first innermost print area to provide a more flexible connection between the two areas; and attaching the pellicle frame to the third area.

* * * * *